(12) United States Patent
Dale et al.

(10) Patent No.: US 7,078,899 B2
(45) Date of Patent: Jul. 18, 2006

(54) PARETO-OPTIMAL MAGNETIC RESONANCE DATA ACQUISITION

(75) Inventors: Brian M. Dale, Euclid, OH (US); Jeffrey L. Duerk, Avon Lake, OH (US); Jonathan S. Lewin, Baltimore, MD (US)

(73) Assignee: Case Western Reserve University, Cleveland, OH (US)

( * ) Notice: Subject to any disclaimer, the term of this patent is extended or adjusted under 35 U.S.C. 154(b) by 0 days.

(21) Appl. No.: 10/847,224

(22) Filed: May 17, 2004

(65) Prior Publication Data

US 2005/0057249 A1    Mar. 17, 2005

Related U.S. Application Data

(60) Provisional application No. 60/471,290, filed on May 15, 2003.

(51) Int. Cl.
*G01V 3/00* (2006.01)
*A61B 5/055* (2006.01)

(52) U.S. Cl. .................. 324/314; 324/307; 324/318; 600/411; 600/416

(58) Field of Classification Search ................ None
See application file for complete search history.

(56) References Cited

U.S. PATENT DOCUMENTS

| | | | | |
|---|---|---|---|---|
| 4,789,933 | A * | 12/1988 | Chen et al. ............. | 382/128 |
| 5,270,653 | A * | 12/1993 | Pauly ..................... | 324/309 |
| 5,402,067 | A * | 3/1995 | Pauly et al. ............ | 324/307 |
| 5,485,086 | A * | 1/1996 | Meyer et al. ........... | 324/307 |
| 5,539,313 | A * | 7/1996 | Meyer .................... | 324/309 |
| 5,604,434 | A * | 2/1997 | Schomberg ............. | 324/309 |
| 5,652,516 | A * | 7/1997 | Adalsteinsson et al. .. | 324/309 |
| 5,758,646 | A | 6/1998 | Bruijns et al. | |
| 5,910,728 | A * | 6/1999 | Sodickson .............. | 324/309 |
| 5,912,557 | A * | 6/1999 | Wilman et al. ......... | 324/309 |
| 6,020,739 | A * | 2/2000 | Meyer et al. ........... | 324/309 |
| 6,215,306 | B1 * | 4/2001 | Tsai et al. .............. | 324/309 |

(Continued)

FOREIGN PATENT DOCUMENTS

EP    WO 2004/104610 A2 *  12/2004

OTHER PUBLICATIONS

Coello, Coello C A et al.: "An approach to Multiobjective Optimization Using Genetic Algorithms" Proceedings Intelligent Nueral Networks. vol. 5, Nov. 1995, pp. 411-416, XP000900855, p. 412-413.

(Continued)

*Primary Examiner*—Diego Gutierrez
*Assistant Examiner*—Tiffany A. Fetzner
(74) *Attorney, Agent, or Firm*—Hahn Loeser & Parks

(57) ABSTRACT

A magnetic resonance data acquisition method includes designating a plurality of parameters that are representative of conditions for acquiring data from a magnetic resonance apparatus, at least one of the parameters being variable; designating at least one objective function measuring the quality of the acquired magnetic resonance data; optimizing the at least one objective function using an optimization algorithm to find at least one set of optimum values for the parameters characterizing data acquisition; configuring the magnetic resonance apparatus with the parameters determined above, configuring by one set of the optimum values of the parameters, and instructing a magnetic resonance imaging apparatus to apply the field to the target of the data acquisition to acquire the data.

41 Claims, 10 Drawing Sheets

U.S. PATENT DOCUMENTS

| | | | |
|---|---|---|---|
| 6,272,479 B1* | 8/2001 | Farry et al. | 706/13 |
| 6,288,547 B1* | 9/2001 | Heid | 324/322 |
| 6,400,152 B1* | 6/2002 | Cline et al. | 324/309 |
| 6,483,306 B1* | 11/2002 | Hahn | 324/307 |
| 6,801,037 B1* | 10/2004 | Zhang | 324/309 |
| 6,933,720 B1* | 8/2005 | Zhang | 324/309 |
| 6,937,014 B1* | 8/2005 | Sun et al. | 324/303 |
| 6,937,015 B1* | 8/2005 | Heid | 324/307 |
| 2003/0109781 A1* | 6/2003 | Zhang | 600/410 |
| 2003/0216636 A1* | 11/2003 | Paley et al. | 600/410 |
| 2004/0044280 A1* | 3/2004 | Paley et al. | 600/410 |
| 2004/0260173 A1* | 12/2004 | Salerno et al. | 600/420 |
| 2005/0017717 A1* | 1/2005 | Duerk et al. | 324/307 |
| 2005/0033153 A1* | 2/2005 | Moriguchi et al. | 600/410 |
| 2005/0057249 A1* | 3/2005 | Dale et al. | 324/307 |
| 2005/0074152 A1* | 4/2005 | Lewin et al. | 382/128 |

OTHER PUBLICATIONS

Sabat, S., Irarrazaval P.: "Three Dimensional K-Space Trajectory Design Using Genetic Algortihms" Proceedings of the International Society for Magnetic Resonance in Medicine, Tenth Meeting Proceedings, May 18, 2002, XP002303182 Honolulu, HI, USA (entire document).

Dale, B.M. et al.: "Genetic design of variable-density sprial trajectories to minimize off-resonance and flow effects" Proceedings of the International Society for Magnetic Resonance in Medicine, Eleventh Meeting Proceedings, Jul. 10, 2003, XP002303182 Toronto, Ontario, Canada (entire document).

Soltanian-Zadeh H. et al.: "Optimization of MRI protocols and pulse sequence parameters for eigenimage filtering" Nuclear Science Symposium and Medical Imaging Conference, 1992., Conference Record.

Noll D.C.: "A Genetic Algorithm for Optimal Design of spectrally Selective K-Space" Proceedings of the International Society for Magnetic Resonance in Medicine, Ninth Meeting Proceedings Apr. 21, 2001, XP002303184 Glasgow, Scotland, UK (entire document).

Tsai, C-M et al: "Reducing Aliasing Artifacts Using Variable-Density K-Space Sampling Trajectories", Magnetic Resonance in Medicine, Academic Press, Duluth, MN, US, vol. 43, No. 3 Mar. 2000, pp. 452-458, XP002179553 ISSN: 0740-3194 **Sections—"Variable-Density Spiral Trajectories" and "Off-Responnace Effects".

* cited by examiner

▨ GROUP 1 (VERTICAL LINE)
▨ GROUP 2 (TOP HORIZONTAL LINE)
▨ GROUP 3 (BOTTOM HORIZONTAL LINE)
○ PARETO-OPTIMAL TRAJECTORIES
□ SUB-OPTIMAL TRAJECTORIES
☆ 128 VIEW RADIAL: GROUP 2
△ 9 INTERLEAF SPIRAL: GROUPS 1 & 3

HIGH-BANDWIDTH CHEBYSHEV PARAMETERIZATION

CHEBYSHEV GRADIENT PARAMETERIZATION

PARETO-OPTIMAL MAGNETIC RESONANCE DATA ACQUISITION

CROSS REFERENCED TO RELATED APPLICATION

This application incorporates by reference in entirety, and claims priority to and benefit of, the U.S. Provisional Patent Application No. 60/471,290, filed on 15 May 2003.

BACKGROUND

Magnetic Resonance Imaging (MRI) is one of the most important modern medical imaging modalities, with approximately 18 million procedures performed in 2001. MRI is currently used in three main areas: diagnostic imaging (dMRI), interventional imaging (iMRI), and quantitative imaging. Most commonly, it is used clinically for a variety of diagnostic procedures. These diagnostic procedures usually require high spatial resolution, high SNR, and low artifact levels. Additionally, it is important to have strong contrast between normal and pathological tissues. Available contrasts include: diffusion-weighted imaging for stroke; perfusion imaging for vascular tumors and infarction; spin-lattice (longitudinal) relaxation characteristic time constant T1 contrast; spin-spin (transverse) relaxation characteristic time T2 contrast; flow-sensitive imaging and MR angiography for detecting a variety of vascular pathologies, malformations and cardiac defects; and others.

Many of the background concepts and terminology used herein to describe or refer to MR imaging systems and their principles may be found, for example, in the book, titled "*Magnetic Resonance Imaging: Physical Principles and Sequence Design,*" by Haacke, et al., John Wiley & Sons (Wiley-Liss), 1999.

The raw data in MRI is acquired in k-space, which is the spatial frequency (also known as the Fourier domain) representation of the image or images of interest. In typical MRI data acquisition methods, k-space data are acquired—one line at a time—on a rectilinear (Cartesian) grid matrix. The image is then reconstructed, typically by using a fast Fourier transform (FFT) technique. However, rectilinear (Cartesian) data sampling methods are usually not time-efficient, and the reconstructed images may be affected by flow and motion artifacts. For this reason, some clinicians have proposed to use non-rectilinear (non-Cartesian) sampling paths, or trajectories, in k-space to acquire MRI data. One exemplary non-rectilinear trajectory is a spiral trajectory which permits acquisition of an MR image in 100 msec or less. Such spiral trajectories provide excellent immunity to flow artifacts and variable tissue contrast. However, since spiral trajectories sample only a limited number of points in k-space, such trajectories, if not properly selected, may introduce unwanted artifacts.

Most current k-space trajectory design techniques essentially begin with a trajectory shape that is easy to visualize and realize. The properties of the trajectory are examined and the real-space MRI image obtained from the various trajectories is then examined by a clinician for unwanted artifacts, and to ensure a faithful rendition of the tissue image. Two of the more common classes of non-rectilinear trajectories are spiral and radial. These two classes have several desirable properties, including rapid acquisitions and benign artifact patterns.

Most current techniques for designing k-space trajectories rely on the skill and expertise of clinicians, technicians, researchers, and other personnel, mostly employing heuristic rules derived from a collective available experience. In addition, in most cases, the clinician may not be able to ascertain the suitability of a trajectory without an unduly large number of trials, and may not be able to select or design a k-space trajectory that is optimized for more than one imaging parameter.

SUMMARY OF THE INVENTION

A general understanding of the impact of k-space trajectories on MR image quality has been quite limited. Accordingly, there is a need for a method and system that can design and optimize k-space trajectories, in particular non-rectilinear k-space trajectories, based on imaging criteria selected by a clinician for an application at hand. More generally, there is a need for selecting optimal (in a sense to be discussed below) MR sequences, whether rectilinear or non-rectilinear.

According to one aspect, the systems and methods described herein are directed at a magnetic resonance data acquisition method that includes: designating parameters that characterize a quality of the magnetic resonance data acquisition, at least one of the parameters being variable; designating objective functions representative of a quality of the acquired magnetic resonance data; applying a multi-objective optimization algorithm to a subset of the parameters to determine a Pareto-optimal set of values for the parameters; and acquiring the magnetic resonance data by configuring a magnetic resonance data acquisition apparatus based at least in part on the determined parameters.

According to one practice, the multi-objective optimization algorithm includes an evolutionary algorithm. According to one embodiment, the evolutionary algorithm includes a genetic algorithm.

According to another aspect, the systems and methods described herein are directed at a method of designing a k-space trajectory for magnetic resonance image data acquisition, including: designating objectives representative of a quality of acquired magnetic resonance data; designating parameters specifying an initial k-space trajectory; applying a genetic algorithm to the parameters to produce genetically-modified parameters; and computing the objective measure for the genetically modified k-space data and, if a quality measure of the objectives associated with the genetically-modified parameters is inferior to a predetermined quality value, repeating the application of the genetic algorithm to the parameters until the quality measure is substantially equivalent or superior to the predetermined quality value.

Exemplary embodiments may include one or more of the following features. The objective measures may include image acquisition time/speed, aliasing energy, off-resonance blurring, flow-sensitivity, contrast-to-noise ratio (CNR), perceptual difference, point-spread function main-lobe width, engineering costs, quantitative imaging precision, and other objective image-quality measures and process-quality measures. The optimization constraints may include gradient stimulation and specific absorption rate (SAR) limits and hardware constraints (such as maximum slew-rate and gradient amplitude). Optimized parameters may include repetition time (TR); echo time (TE); number of interleaves, views, or repetitions; flip angle; coil diameter; whether fat suppression or flow compensation is performed; type of coil used (e.g., saddle coil, opposed solenoid, etc.); and other parameters suitable to describe a quality attribute of an image. The exemplary genetic algorithm may be designed to find a set of center-out trajectories (in k-space) that are Pareto-optimal with respect to at least one objective measure relevant to the application of interest.

A Pareto-optimal trajectory, designed according to the systems and methods described herein, may have non-intuitive features that are unexpected even to a trained and experienced individual entrusted to design a k-space scanning trajectory. For example, in one embodiment—designed to minimize aliasing energy (in the image domain) and acquisition time—the optimal trajectory is an unconventional single-interleaf variable-density spiral (VDS). In another embodiment—designed to minimize flow sensitivity and off-resonance blurring—the systems and methods described herein suggest a six-interleaf VDS as being Pareto-optimal. Uniform-density spirals may be close to, but not quite, Pareto-optimal in these two embodiments.

The optimization algorithm may be an evolutionary or a genetic algorithm, which terminates when a predetermined termination condition is met after the algorithm runs for at least one generation. The algorithm may begin with an initial population that is randomly selected, or with a population that is selected from an experience base. Each generation may implement a reproduction, a cross-over operator, and/or a mutation operator.

According to yet another aspect, the systems and methods described herein are directed at a method of designing a magnetic resonance pulse sequence, including: designating objectives characteristic of a quality of magnetic resonance data obtained by using the pulse sequence; designating parameters specifying an initial pulse sequence; applying a genetic algorithm to the parameters to produce genetically-modified parameters; and if a quality measure of the objectives associated with the genetically-modified parameters is inferior to a predetermined quality value, repeating step c until the quality measure is substantially equivalent or superior to the predetermined quality value, whereby a final set of genetically-modified parameters specifies the designed pulse sequence. The designed pulse sequence may correspond to magnetic resonance data acquisition based on a rectilinear k-space approach, or it may correspond to a non-rectilinear k-space data acquisition approach (e.g., spiral or radial trajectories).

Moreover, the systems and methods described herein are suitable for automating trajectory design and selection based on the optimization of at least one objective function or measure (although typically a plurality of objective measures are optimized).

Further features and advantages of the systems and methods described herein will be apparent from the following description of preferred and other embodiments, as well as from the claims.

BRIEF DESCRIPTION OF THE DRAWINGS

The following figures depict certain illustrative embodiments of the systems and methods described herein in which like reference numerals refer to like elements. These depicted embodiments are to be understood as illustrative, and not as limiting in any way.

DETAILED DESCRIPTION OF CERTAIN ILLUSTRATED EMBODIMENTS

Figure 1:
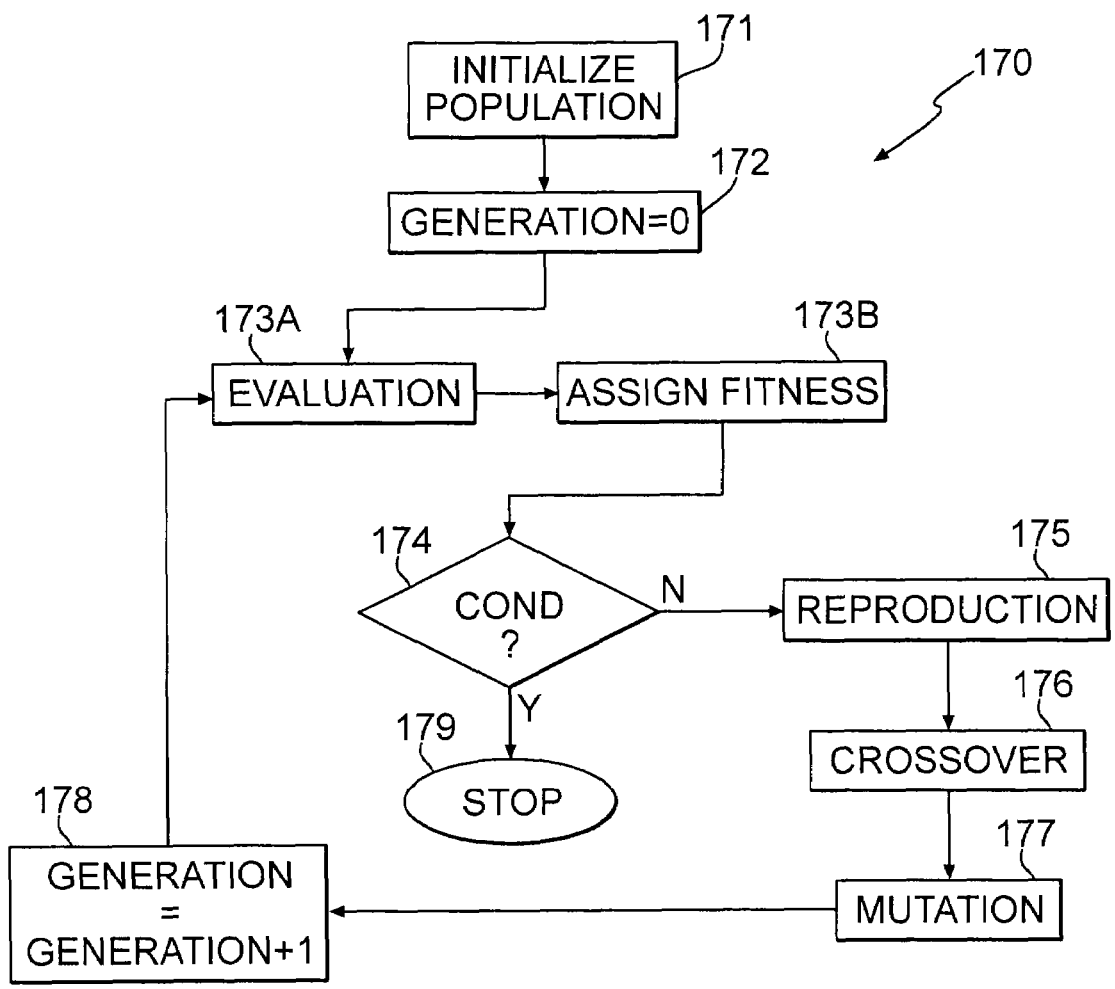
FIG. 1 depicts a flowchart of a genetic algorithm (GA).

Certain illustrative embodiments will now be described. The systems and methods described herein are directed to improving MR imaging techniques, whereby k-space scanning trajectories are optimally and automatically designed, using a suitable genetic algorithm, based on predetermined objective functions and hardware and safety constraints. It will be understood by one of ordinary skill in the art that the systems and methods described herein may be adapted and modified for other suitable applications, and that such other additions and/or modifications will not depart from the scope hereof.

The exemplary non-rectilinear k-space trajectories described herein are designed at least partially based on a non-linear, multi-modal, non-differentiable, multi-objective optimization problem. A non-rectilinear k-space trajectory is described as a multi-parameter function, and may have spiral-like components, linear components, or both. These properties make such an optimization problem substantially intractable for most optimization techniques; however, the methods and systems described herein take advantage of the suitability of genetic algorithms for finding globally-optimal solutions for such problems. In addition, some genetic algorithms are suitable for sampling substantially the entire Pareto-optimal set for multi-objective problems, and they are able to optimize discrete parameters, which are not only common in MRI pulse sequences, but also impossible, or nearly impossible, to include with other optimization methods. The systems and methods described herein employ a suitable genetic algorithm to find a set of center-out trajectories (in k-space) that are Pareto-optimal with respect to at least one objective function relevant to the application of interest.

Trajectories may be encoded, for example, as an integer, representing the number of interleaves and a discrete representation of the trajectory shape. Spiral trajectories are the preferred trajectory shape, although other non-rectilinear (non-Cartesian) patterns, e.g., rosettes and radials, etc. may be used without departing from the scope of the systems and methods described herein. In some of the examples presented below, trajectories are encoded in the form of an integer, representing the number of interleaves, followed by a plurality of real numbers, for example, 12 real numbers, representing the spiral density (dθ/dr) for each of a corresponding number of substantially equal-width annular regions ranging, for example, from about 0 $m^{-1}$ to about 500 $m^{-1}$. It is not necessary to select 12 annular regions; other numbers of annular regions may be appropriate in various contexts. Moreover, the respective widths of the annular regions need not be identical or substantially identical; a subset of the annular regions may have distinct respective widths.

One exemplary algorithm described in more detail below is based on a genetic algorithm. Genetic algorithms (GA) are a class of evolutionary algorithms (EA), and are described, for example, in "*Multi-Objective Optimization using Evolutionary Algorithms,*" by Kalyanmoy Deb, John Wiley & Sons, Ltd., 2001, as well as in an article by Deb et al., titled "*A Fast and Elitist Muliobjective Genetic Algorithm: NSGA-II,*" IEEE Transactions on Evolutionary Computation, Vol. 6, No. 2, pp. 182–197, April 2002.

In contrast to classical optimization methods, which mainly use deterministic transition rules to approach a single optimal solution at each iteration, evolutionary algorithms use a population of solutions, mimicking nature's evolutionary principles, in their quest for an optimal solution (or, as is more often the case, a plurality of optimal solutions).

If an optimization problem has a single solution, then an EA is also expected to produce a final population of solutions, each of whose members has at least substantially converged upon the single optimal solution. On the other hand, if an optimization problem has multiple solutions, then the EA is expected to capture that multiplicity of solutions in its final population. Another advantage of evolutionary algorithms is that they are suitable for finding multiple optimal solutions in a single simulation run. Furthermore, EA-based techniques are suitable for finding multiple optimal solutions in multi-modal optimization problems, as encountered in MRI imaging. These and other advantages of using evolutionary algorithms, in general, and genetic algorithms, in particular make the suitable for deployment in the systems and methods described herein.

Referring first to FIG. 1 depicting a schematic process flow 170, a genetic algorithm (GA) begins with a population of solutions, step 171, and an initial counter setting (the generation number) of gen=0, step 172. The initial population may be randomly selected, but may also be created, or designed, for example, based on prior experience. For example, certain population features may be expected to be more suitable, and this information may be considered when selecting the initial population. In step 173A, each solution in the initial population is evaluated in terms of how it affects the objective functions, and how severely, if at all, it violates the constraints. In step 173B, a fitness measure is assigned to the population members by which they may be rank-ordered based on a metric that rewards meeting of the objective function optimization goals, punishes constraint violations, or both. Consequently, a member of the population that least violates the constraints may be assigned a lower fitness level than the worst member of the population that does not violate the constraints.

In step 174, a termination condition, for example a convergence criterion for the algorithm, is examined. If the termination condition is met, then the algorithm stops at step 179, and the population of the corresponding iteration is declared as the optimum population of solutions. If the termination condition is not met in step 174, the population is modified by at least one of three genetic operators—reproduction, also known as selection (step 175), crossover (step 176), and mutation (step 177)—to produce a new generation of solutions expected to have a better fitness than the previous generation (i.e., is closer to meeting the termination conditions of the algorithm than was the previous generation). Every time a new generation of the population is created, an iteration counter is incremented by one (step 178) to keep track of the number of generations indexed by the optimization algorithm 170. The process 170 then returns to step 173A for an evaluation of the next generation of the population.

The reproduction operator 175 is intended to duplicate good members while eliminating bad members of the population, while keeping the population size substantially constant. A plurality of reproduction operators are known in the art, such as tournament selection (also known as binary selection), proportionate selection (for example, roulette wheel selection (RWS) or the stochastic roulette-wheel selection (SRWS)), and ranking selection.

Whereas the reproduction operator 175 does not add new solutions, the crossover operator 176 and the mutation operator 177 are used to create new solutions. In crossover 176, two population members are selected from the mating pool, typically at random, and some portions of their respective parameterizations (genotypes) are exchanged between them to create two new offsprings. Those of ordinary skill in the art know, or can easily ascertain, that there are various ways of performing crossover. For example, crossover may be single-site or multiple-site. Furthermore, various implementations include linear crossover, blend crossover and its variants, simulated binary crossover, fuzzy recombination crossover, uni-modal normally-distributed crossover, simplex crossover, fuzzy connectives-based crossover, unfair average crossover.

The mutation operator 177 is used to maintain diversity in the population. In a multiple-solution optimization problem, it is desired to have a population that well represents the gamut of the Pareto-optimal boundary. This is to avoid crowding, i.e., clustering of the population around particular regions of the Pareto-optimal boundary. The mutation operator 177 locally alters the genotype representation of a solution, creating a new solution as a result, one that is expected to be better than the solution prior to mutation. The mutation may include a random mutation, a non-uniform mutation, a normally-distributed mutation, a polynomial mutation, another type of mutation, or a combination various mutation types.

To recap, the reproduction operator 175 selects good solutions and replicates them, discarding bad solutions. The crossover operator 176 exchanges subsets of the genotype representations of good solutions to create new and better solutions. The mutation operator 177 modifies the genotype of a good solution locally, to create a better solution.

Another concept commonly used in evolutionary algorithms in general, and genetic algorithms in particular, is elite preservation, whereby the best (elites) of the population are allowed to be directly carried over from one generation to the next. Therefore, a good solution found early on in the run is never discarded or lost, unless a better solution is found subsequently.

Figure 2:
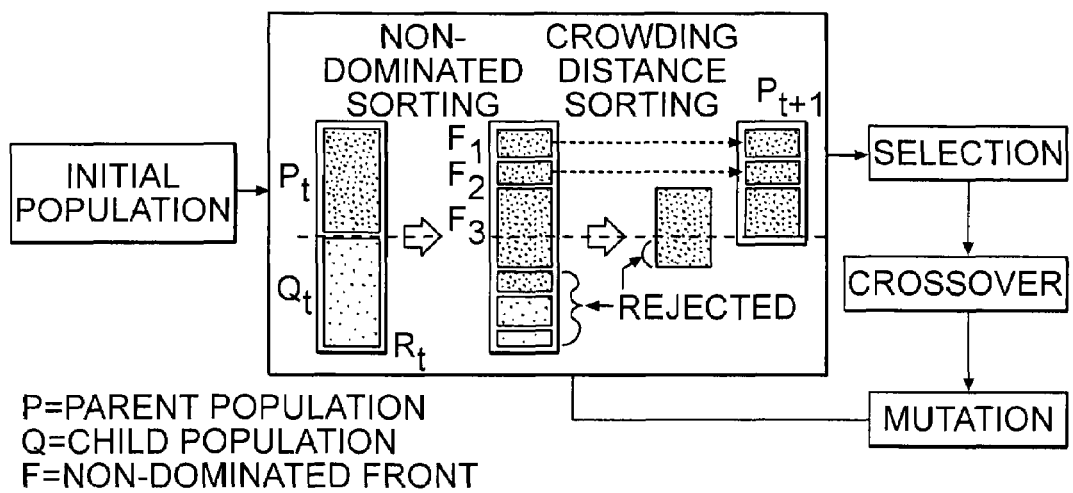
FIG. 2 is a graphical overview of the NSGA-II (Non-dominated Genetic Sorting Algorithm) used in the multi-objective optimization algorithm used by the systems and methods described herein.

Turning now to FIG. 2, multi-objective optimization algorithms may use the concept of domination to compare and rank members of the population. Briefly, a solution p is said to dominate another solution q, if both of the following conditions are met: (1) p is no worse than q in any of the objectives; and (2) p is strictly better than q in at least one objective. Furthermore, if the optimization problem involves constraints that apply to the solutions, then a variant of the above definition of dominance is used. A solution p is said to "constrain-dominate" another solution q if any of the following three conditions are true: (1) p is feasible and q is not; (2) p and q are both infeasible, but p violates the constraints less than does q; and (3) p and q are both feasible, and p dominates q in the ordinary sense of dominance discussed earlier in this paragraph.

A "non-dominated sorting genetic algorithm II (NSGA-II)" is illustrated in FIG. 2. It includes fast non-dominated sorting for convergence to the Pareto-optimal front and a crowded comparison for obtaining diversity along the front. Elitism is introduced by combining the parent and child populations for the non-dominated and crowded sorting. Random selection and/or binary-tournament selection may used. Simulated binary crossover may be utilized in conjunction with polynomial mutation.

In the methods employed for optimizing an MR imaging process, trajectories are selected as an initial population from examples such as, for example and without limitation, spiral, radial, TWIRL, etc. Alternatively, a random population may be selected and the known "genetic diversity" information may be gradually introduced. If the random initial population is problematic, then the initial population contains designed trajectories.

Population size may be varied in increments, for example 25, so that no more than a predetermined percentage (e.g., 10%) of the initial population is non-dominated. Typically this yields population sizes of about 50 to about 150 for about two to about four objectives, although other population sizes and numbers of objectives do not depart from the scope of the systems and methods described herein. The algorithm runs for a predetermined number of generations (e.g., 50 to 100, or perhaps even more) or until it appears to have converged. As evaluation of the various objective functions typically dominates the computation time, parallelization using a master/slave architecture may be used (for example, slaves evaluating the objective functions, masters handling the NSGA-II procedures). Parallelization may be implemented in a mathematical computing environment such as Mathematica (Wolfram Research) using the parallel computing toolkit. The toolkit is capable of parallelization across a network of heterogeneous personal computers. The generational requirement may be relaxed in order to avoid the possibility that the slower computers degrade the performance of the parallelization.

EXPERIMENTAL APPARATUS: Exemplary resources for implementing the systems and methods described herein typically include the following:

Imaging equipment: Sonata 1.5 T MR Scanner (Siemens Medical Solutions, Erlangen, Germany);

Computers: Pentium III and IV computers operating with the Windows NT 4.0 and/or Windows XP operating systems (Microsoft Corporation, Seattle, Wash.);

Sequence design and programming: IDEA (Integrated Development Environment for Applications) Programming Environment (Siemens Medical Solutions, Erlangen, Germany);

Image reconstruction: ICE (Image Calculation Environment) (Siemens Medical Solutions, Erlangen, Germany); and Data analysis and Computer Programming: Mathematica (Wolfram Research, Inc., Champaign, Ill.) and Visual C++ (Microsoft Corporation, Seattle, Wash.).

Those of skill in the art are aware that alternatives to this apparatus set exist, and may be used to implement the systems and methods described herein.

CONSTRAINTS: For the variable-density spiral and high-bandwidth encodings, the waveform is forced to the lower of the slew rate or gradient-amplitude limit at each point in time. For the other encodings, the slew and gradient limits may be enforced either through a feasibility maintenance strategy or through the constrained non-dominated sorting procedure NSGA-II. If used, the feasibility maintenance procedure includes scaling of the entire waveform by the inverse of the maximum relative amount of violation. Gradient stimulation safety limits may be enforced through the constrained non-dominated sorting procedure. Specific absorption rate (SAR) safety constraints typically are not active in most k-space trajectory problems; however, in applications where this is not true they may be enforced through the constrained non-dominated sorting procedure.

OBJECTIVES: Optimization objectives are chosen primarily for their anticipated importance to image quality and necessarily not as much for computational convenience or other desirable mathematical features. Total acquisition time is one objective that is desirable to minimize, as it is particularly important for many applications, including interventional, body, and cardiac MRI. Aliasing energy is another objective that is desirable to minimize, as aliasing energy typically manifests itself as artifact in the final image. It is desirable, too, to minimize off-resonance blurring, because it is a well known source of image degradation in spiral trajectory-based scanning. Flow artifact energy is yet another objective worth minimizing, as flow artifact immunity is another well-known benefit of spirals and may be important in iMRI applications, such as catheter guidance. As mentioned earlier, other potential objectives include contrast-to-noise ratio (CNR), perceptual difference, and point-spread function main-lobe width, among others.

IMPLEMENTATION: After the genetic algorithm converges, selected Pareto-optimal and sub-optimal trajectories may be implemented on the 1.5 T Siemens Sonata using IDEA, or equivalents known to those of skill in the art. This may be achieved by software, which can be developed by those of skill in the art, for handling arbitrarily-shaped gradients within the IDEA framework. Fast Low Angle Shot (FLASH) gradient echo pulse sequence contrast or other contrast variables may be utilized. A look-up-table-based fluoroscopic gridding-reconstruction program (such as that described by Dale, et al. in "*A Rapid Look-Up Table Method for Reconstructing MR Images from Arbitrary K-Space Trajectories*", IEEE Transactions on Medical Imaging, Vol. 20, No. 3, March 2001) may be used for online reconstruction, and tables may be calculated based on the measured trajectory.

Figure 3:
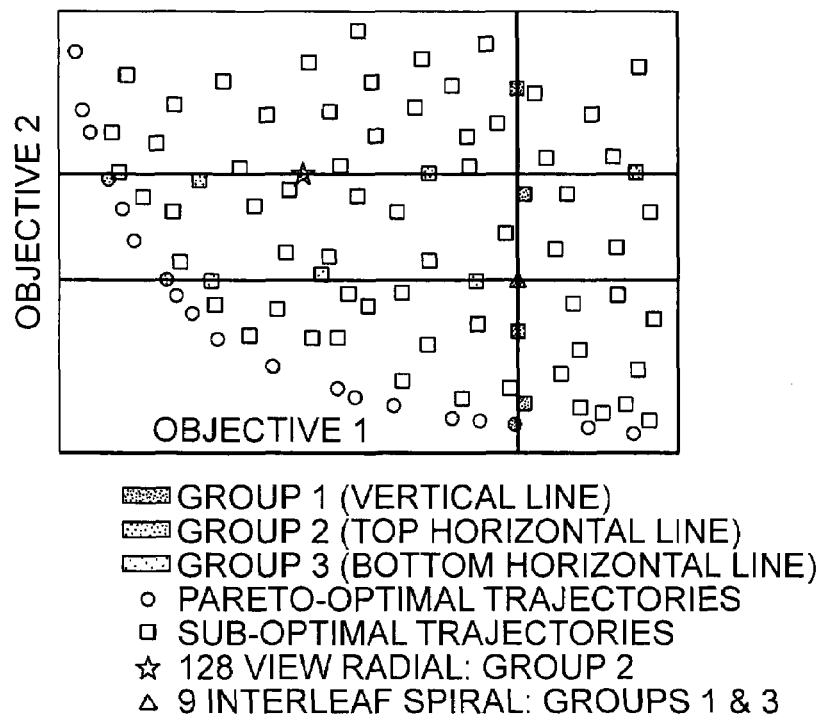
FIG. 3 is an example of the selection scheme for trajectory group assignments.

Turning now to FIG. 3, trajectories may be selected in groups designed to vary in only a single objective and to substantially evenly sample the range of interest, preferably the entire range of interest, for that objective. Each group includes one Pareto-optimal trajectory and one standard spiral or radial trajectory for comparison. At least one group is selected for each objective and each group will consist of a predetermined minimum number of trajectories (e.g., at least 3 trajectories). The region of interest in the objective space may be defined by the hyper-cube formed between the zenith and nadir solutions.

During the optimization process, objective measures are evaluated. One objective measure may be, for example, the off-resonance sensitivity. Off-resonance effects may be caused by, for example, field inhomogeneity, susceptibility, chemical shift, and the like. Off-resonance effects may be evaluated using the following procedure:

1) Decode the k-space trajectory from the genetic parameters.
2) Generate two sets of data by evaluating two mathematical phantoms at each point along the trajectory. The two mathematical phantoms contain the same spatial information, but one is completely, or nearly completely, on resonance whereas the other varies from about −100 Hz to about +100 Hz off-resonance.
3) Reconstruct each set of simulated data using a convolution-based gridding-reconstruction.
4) Determine the total energy of a difference between the two images.

To recreate this simulated measure of off-resonance sensitivity, a procedure such as the following could be used:

1) Implement the k-space trajectory on, for example, a 1.5 Tesla Siemens Sonata using an integrated development programming environment, such as IDEA.
2) Acquire two resolution-phantom data sets. Keep all parameters the same, except to acquire the first after careful shimming and the second after setting one of the first-order shim coils to induce an off-resonance variation of about 100 Hz (16 µT/m) across the phantom.
3) Reconstruct each set of acquired data using a convolution-based gridding-reconstruction.
4) Calculate the total energy of a difference between the two images.

Except for acquisition time, which simply is noted from the user interface, similar procedures may be followed for each objective, such as motion artifacts.

For aliasing energy, the well-shimmed phantom may be used and two images acquired: one image is acquired with a sufficiently high number of interleaves (e.g., 400) to ensure that there is no aliasing energy, even for a simple radius trajectory; the other image is acquired with the indicated number of interleaves.

For flow-sensitivity, two images along a design flow phantom may be acquired. One is acquired at V=0 cm/sec; the other may be acquired after the mean flow velocity in the, for example, 0.75" I.D. distensible tubing is set to about 33 cm/sec (near the mean flow rate in the aorta).

EXAMPLE 1

Figure 4:
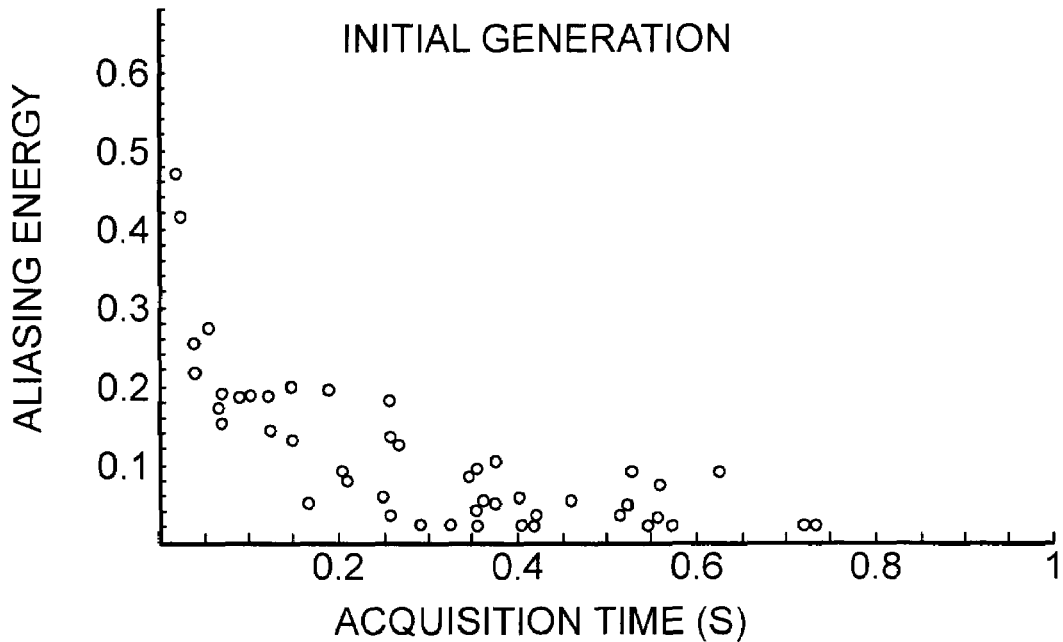
FIG. 4 depicts objective measures corresponding to the initial population in a first embodiment designed to minimize acquisition time and aliasing energy.

Referring now to FIG. 4, the aforedescribed method optimizes the k-space trajectory for both acquisition time and aliasing energy (in the image domain), with the goal of minimizing each. These objectives are merely exemplary and chosen for their simplicity and ease of computation.

In a first exemplary embodiment, trajectories are encoded as an (n+1)-tuple (e.g., an (n+1)-vector), wherein the first number represents the number of interleaves, followed by n real numbers, representing the spiral density (dθ/dr) for each of n annular regions of substantially equal width ranging, for example, from about 0 $m^{-1}$ to about 500 $m^{-1}$. The following (n+1)-tuple was used in Example 1: [1, 0.804248, 0.804248, 0.804248, 0.804248, 0.813981, 0.781736, 0.804248, 0.75656, 0.837202, 0.804248, 0.804248, 0.754025]. The first number is the number of interleaves (=1), and the remaining twelve numbers denote the spiral density dθ/dr for 12 corresponding annular regions.

The trajectory is determined by stepping in increments of about 10 µs, the maximum possible incremental distance along the spiral, limited either by the slew-rate (e.g., about 200 T/m/s) or gradient amplitude (e.g., about 40 mT/m) constraint, which are some of the hardware constraints mentioned above. If no such feasible step exists (for instance, at a corner in the desired trajectory) then the k-space location is chosen that minimizes a difference between the desired and actual spiral density dθ/dr, subject to the aforementioned slew-rate and gradient amplitude constraints. The hardware constraints may be fixed or adjustable and may be different for different imaging systems. The methods described herein are not limited to a particular MRI system or evaluation or control process.

According to one practice, the total acquisition time is determined by multiplying the number of trajectory points by the incremental stepping value (about 10 µs in this embodiment), adding time for excitation and spoiling (about 2 ms in this embodiment), and multiplying by the number of interleaves (1 in this embodiment). The total acquisition time is about 67 ms.

The aliasing energy may be determined from the envelope of the signal energy as a function of k-space radius, measured from a series of cardiac spiral data sets. In one embodiment, maximum expected aliasing energy is determined by fitting a Lorentzian (as a function of the k-space radius) to the envelope formed from a series of four spiral cardiac data sets; an alternative embodiment may entail a larger or smaller number of data sets. The energy from a given k-space grid point is considered to alias into the image if no sample is within the unit square centered on the grid point.

In one embodiment, the NSGA-II (Non-Dominated Sorting Genetic Algorithm II), described by Deb et al., in IEEE Trans. Evol. Comp., 6(2), pp. 182–197, 2002, is implemented using a software package such as Mathematica (Wolfram Research, Inc., Champaign, Ill.). The population size is chosen to be 50 trajectories and the algorithm is set to run for 50 generations. A larger or smaller initial population size, or an alternative number of runs, more or fewer than 50, may be chosen, without departing from the scope of the systems and methods described herein. Simulated binary crossover and polynomial mutation are used with $\eta_c = \eta_p = 3$ and random parent selection (as described by Deb in *Multi-Objective Optimization using Evolutionary Algorithms*, 2001).

Figure 5:
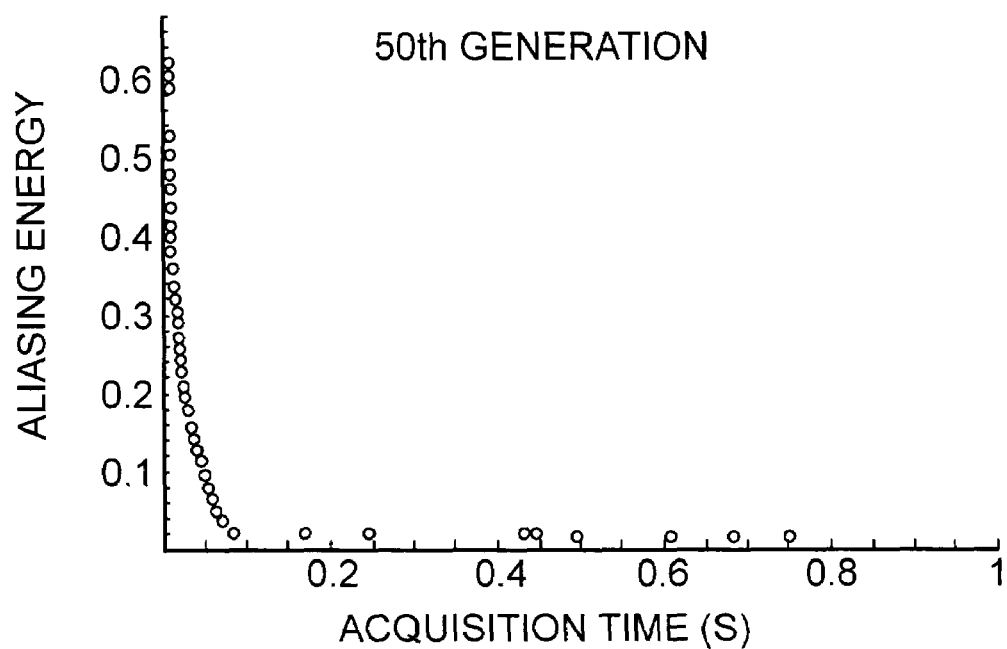
FIG. 5 depicts the objective measures of FIG. 4 corresponding to the $50^{th}$ generation, wherein the solutions approach a Pareto-optimal boundary.

FIG. 4 shows the objective function's aliasing energy and acquisition time for an initial generation of trajectories, whereas FIG. 5 shows the last generation (50$^{th}$ in this example), which exhibits a sharp "elbow" region at an acquisition time of approximately 0.075 sec in the Pareto-optimal set, indicating a location of rapidly diminishing returns. The flatness of the region to the right of the elbow indicates that great improvements in acquisition speed are possible (more than about a ten-fold reduction), at the expense of only a small increase in the aliasing energy; beyond the elbow to the left, however, an improvement in acquisition time is associated with a substantial increase in the aliasing energy.

Figure 6:
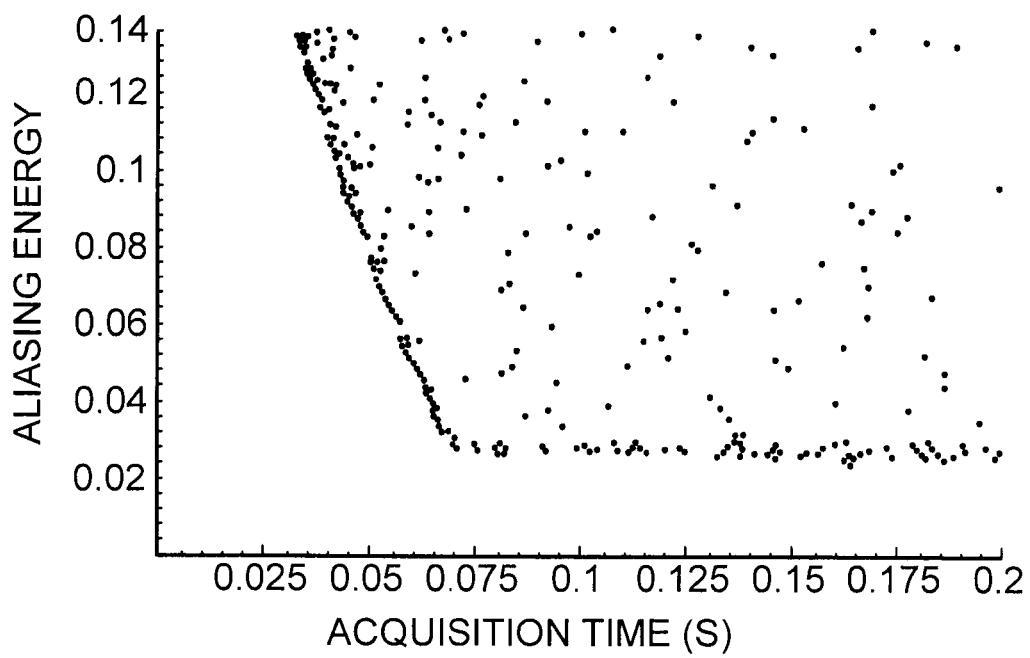
FIG. 6 shows an archive of all objective measures acquired in the optimization problem of FIGS. 4 and 5.
Figure 7:
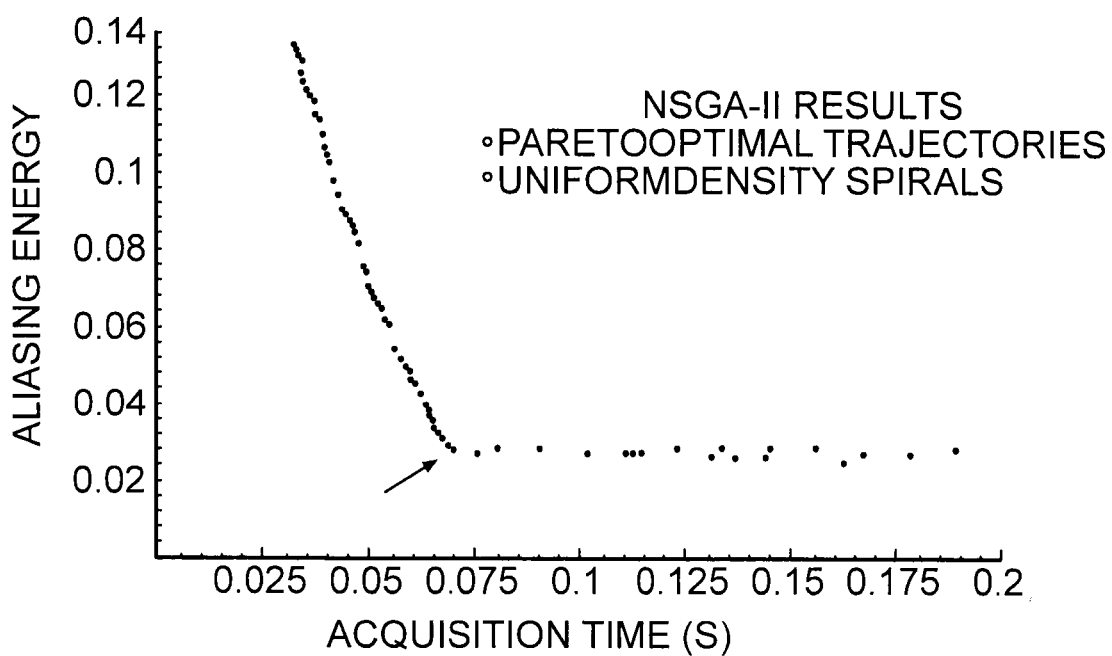
FIG. 7 depicts the "elbow" in the Pareto-optimal set, at the $50^{th}$ generation according to FIG. 5, using the NSGA-II Algorithm.

FIGS. 6 and 7 show, on an expanded scale, an archive of all the runs executed in the algorithm aimed at minimizing acquisition time and aliasing energy. FIG. 7 shows the elbow region in detail. The black dots denote Pareto-optimal trajectories from the archived set of all trajectories tested through all 50 generations.

The gray dots represent several constant-density spirals. The arrow in FIG. 7 indicates the "best trade-off" trajectory, which is a single-interleaf variable-density spiral (time: approximately 69 ms). Differences between this trajectory and a uniform-density spiral are difficult to appreciate visually. The gray dot to the right of the arrow denotes a uniform-density single-shot spiral (time: approximately 81 ms). In this example, the density variations in the best trade-off trajectory are very small, and are genetically selected to increase the acquisition speed (by 17% in this example), while keeping the increase in aliasing energy as small as possible, relative to the single-shot spiral. The resultant gradient waveforms are easily implemented on modern MRI systems, while conventional reconstruction methods may be used for reconstructing the image.

Figure 8:
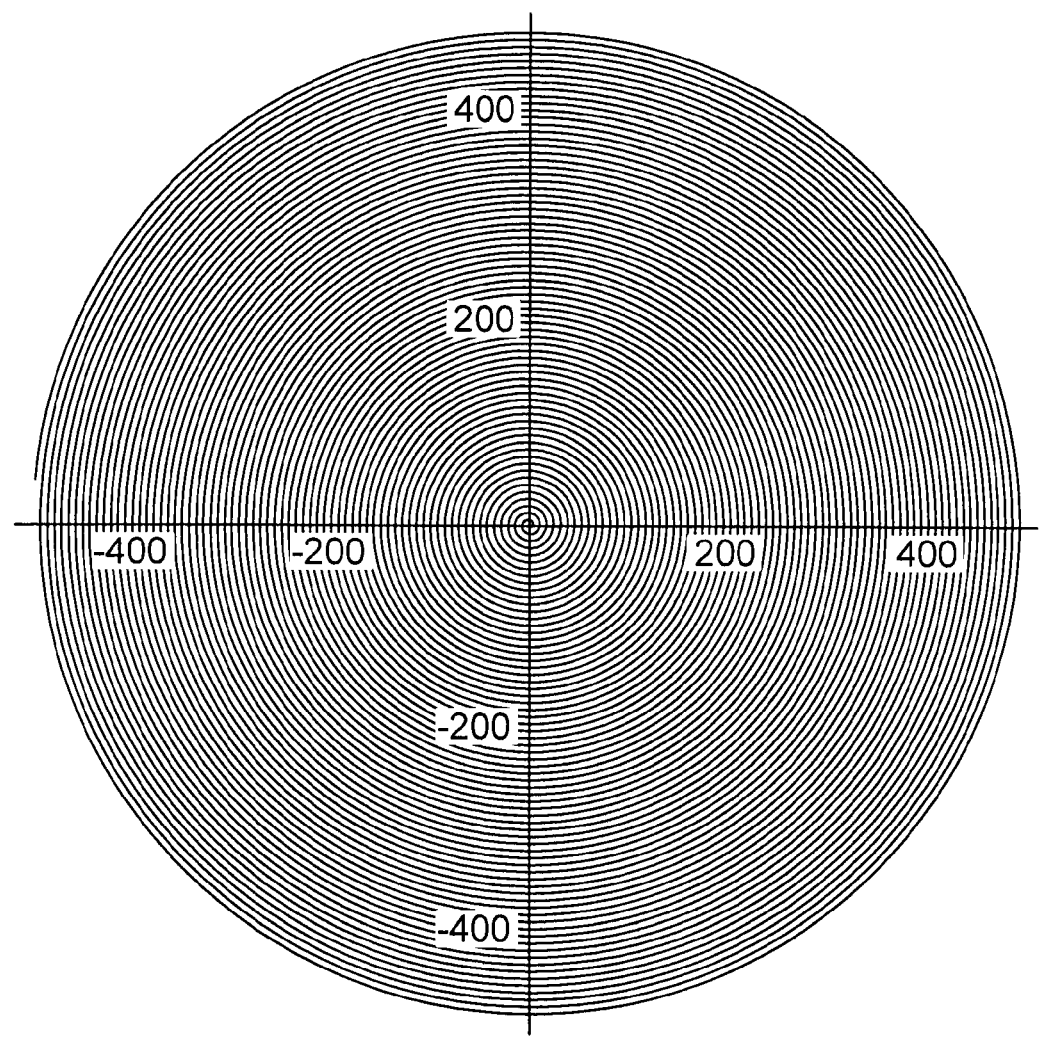
FIG. 8 depicts the single-interleaf trajectory at the elbow of the Pareto-optimal set in FIG. 7.
Figure 9:
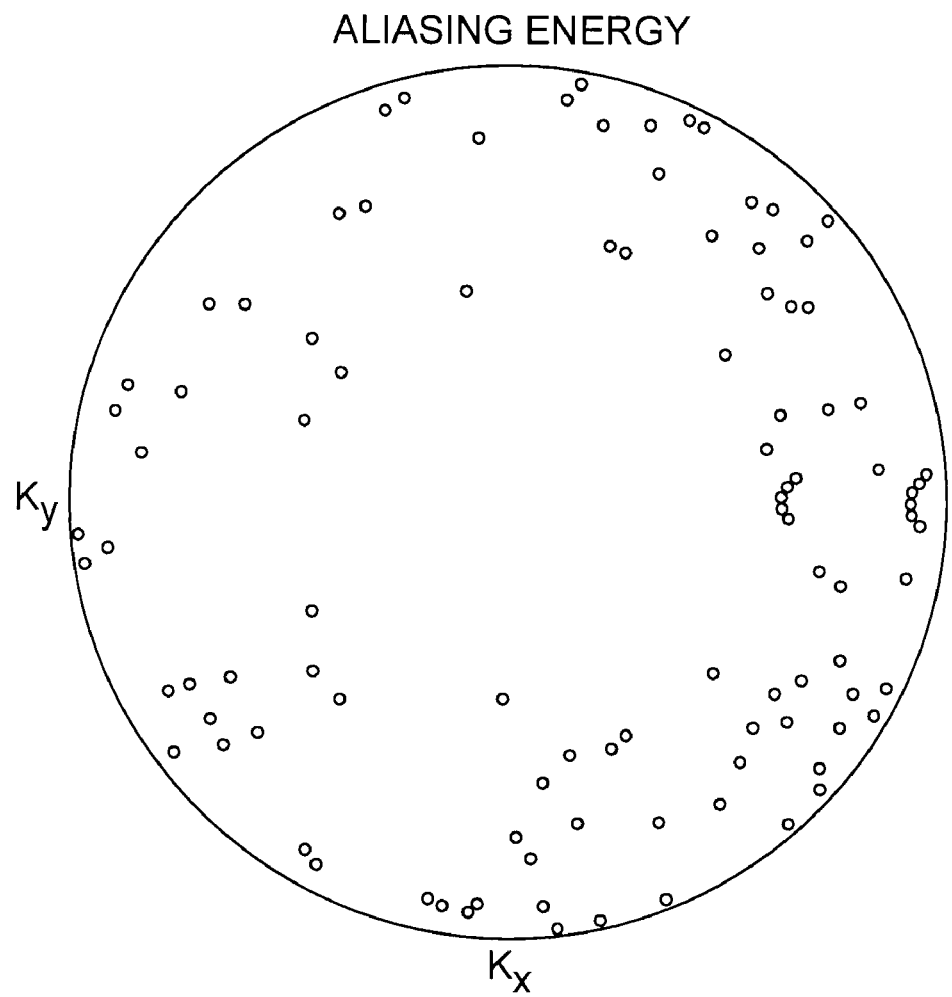
FIG. 9 denotes the aliasing energy, in k-space, corresponding to the trajectory from the corner of the Pareto-optimal set in FIG. 6.

FIG. 8 shows the best-tradeoff spiral trajectory pointed to by the arrow of FIG. 7. FIG. 9 depicts a map of the aliasing energy in k-space, corresponding to the trajectory from the elbow of the Pareto-optimal set pointed to by the arrow of FIG. 7. The dark areas correspond to a low aliasing energy, and the light areas correspond to a greater aliasing energy.

Although uniform-density spirals may be close to Pareto-optimal, the best trade-off trajectory for optimizing the objective functions in this example, where acquisition time and aliasing energy are minimized, is a new type of single-shot variable-density spiral (VDS).

EXAMPLE 2

In a second example, k-space trajectory design is formulated in terms of an optimization problem aimed at minimizing off-resonance blurring while retaining the beneficial flow properties of spiral trajectories. As has been mentioned, spiral imaging is significantly less sensitive to flow artifacts, but exhibits increased sensitivity to off-resonance blurring. This may be particularly problematic in applications, such as cardiac imaging, where sharp changes in tissue susceptibility exist near the region of interest. An optimized trajectory may be expected to retain the advantageous relative insensitivity to flow, while being also less sensitive to off-resonance effects.

Off-resonance and flow-artifact energy are multi-modal, non-differentiable, and highly non-linear functions of the k-space trajectory. Most optimization techniques are unsuitable for handling such intractable, or nearly intractable, functions. The multi-objective genetic algorithms described above, however, are well-suited for handling such functions and finding globally Pareto-optimal solutions. The systems and methods described herein employ a suitable multi-objective genetic algorithm is used to find the set of center-out trajectories that are Pareto-optimal with respect to flow-artifact and off-resonance blurring.

In Example 2, as was the case in Example 1, trajectories are encoded as (n+1)-tuples representing the number of interleaves, and a predetermined number of real numbers.

As in Example 1, the trajectory is calculated by stepping in increments of about 10 μs—the maximum possible distance along the spiral, limited by the slew-rate (about 200 T/m/s) or gradient amplitude (about 40 mT/m) constraints. If no such feasible step exists (for instance, at a corner in the desired trajectory) then the k-space location is chosen that minimizes the difference between the desired and actual spiral density dθ/dr, subject to the slew-rate and gradient amplitude constraints.

Flow sensitivity is calculated using the velocity k-space formalism (such as that put forth by Nishimura et al. in "*A Velocity k-Space Analysis of Flow Effects in Echo-Planar and Spiral Imaging*", Magnetic Resonance in Medicine, 33:549–556, 1995) to simulate a vessel with plug flow (approximately 1 m/s). The resulting data is sampled along the trajectory and reconstructed with conventional gridding-reconstruction, such as that described by O'Sullivan in the IEEE Transactions on Medical Imaging, MI-4. 1985. The ideal image is subtracted from the reconstructed image and the total energy of the difference is determined. Off-resonance sensitivity is calculated similarly, using, for example, a simulated 100 Hz global off resonance.

The NSGA-II algorithm is implemented using Mathematica (Wolfram Research, Inc., Champaign, Ill.). Simulated binary crossover and polynomial mutation are used with $\eta_c = \eta_p = 3$ and random parent selection (as described by Deb in "Multi-Objective Optimization Using Evolutionary Algorithms", Wiley, 2001). The population size is 50 and the algorithm runs for 200 generations.

Figure 10:
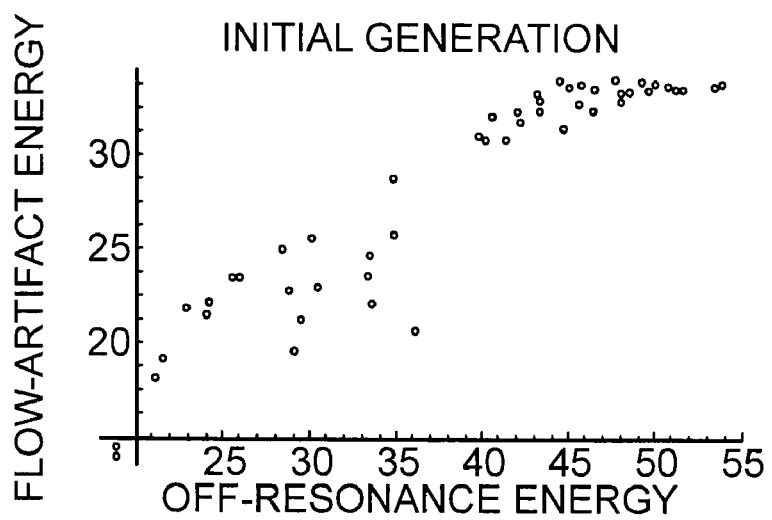
FIG. 10 depicts objective measures corresponding to the initial population in a second embodiment designed to minimize off-resonance blurring and flow-artifact energy.
Figure 11:
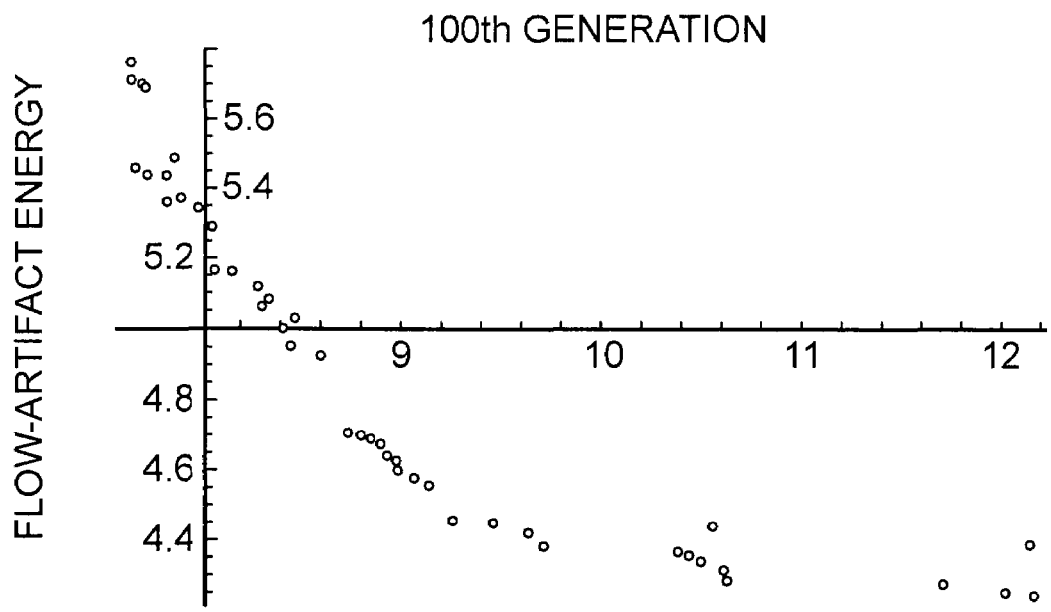
FIG. 11 depicts the objective measures of FIG. 10 corresponding to the $100^{th}$ generation, wherein the solutions approach a Pareto-optimal boundary.

FIG. 10 shows the objective function's flow-artifact energy and off-resonance energy for an initial generation of trajectories, whereas FIG. 11 shows the last generation ($100^{th}$ in this example). In contrast to the Pareto-optimal curve of Example 1, the Pareto-optimal curve of Example 2 does not have a sharp "elbow" region; this tends to indicate a stronger interdependence between the objective functions. In other words, there is no clearly-defined point of diminishing returns.

Figure 12:
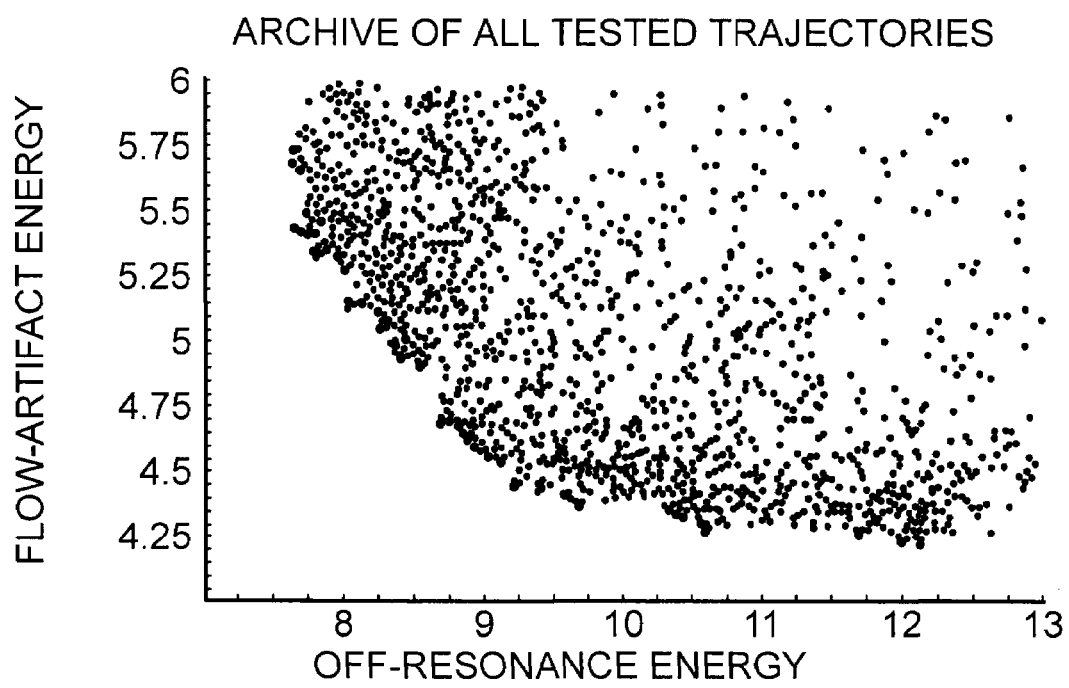
FIG. 12 shows an archive of all objective measures acquired in the optimization of FIGS. 10 and 11.
Figure 13:
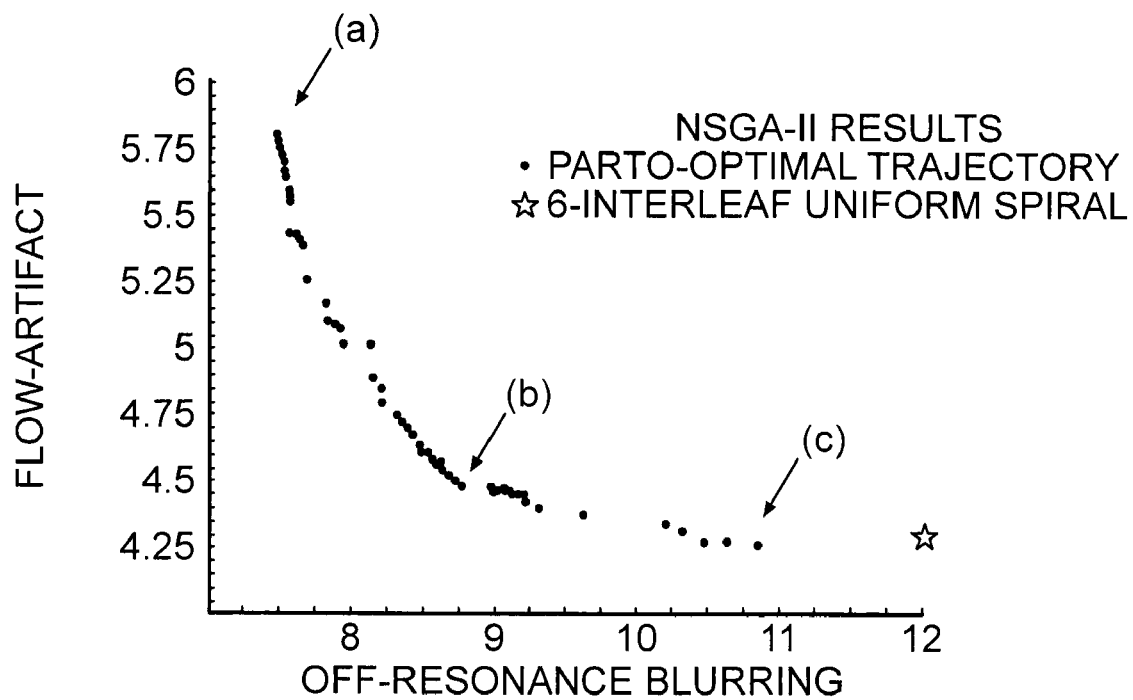
FIG. 13 depicts the Pareto-optimal set of trajectories from the optimization of FIGS. 10 to 12.
Figure 14:
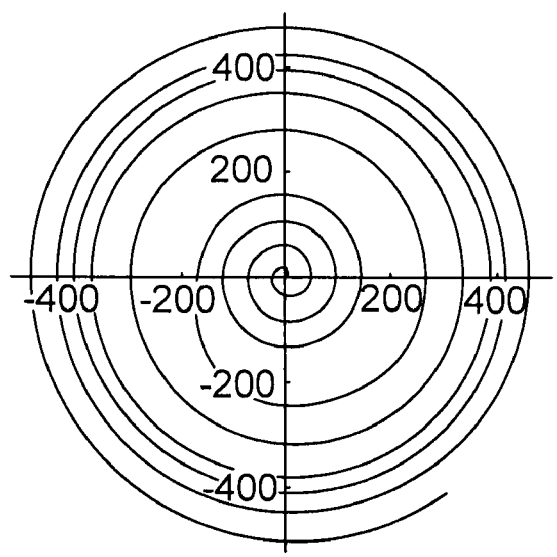
FIG. 14 depicts one interleaf of the six-interleaf trajectory indicated by the arrow of FIG. 13.

FIG. 12 shows, on an expanded scale, an archive of all the runs executed in the algorithm aimed at minimizing flow and off-resonance artifacts. FIG. 13 shows the Pareto-optimal region of FIG. 12 in greater detail. The dots denote the Pareto-optimal trajectories from an archive of all trajectories tested through all the generations. The star represents a six-interleaf constant-density spiral. All of the trajectories are non-dominated by the last generation. All of the Pareto-optimal trajectories have six interleaves. The arrow (b) of FIG. 13 indicates a trajectory selected from approximately the middle of the Pareto-optimal region, and FIG. 14 shows one exemplary interleaf of this trajectory. Note the low-density spiral pattern at mid-range frequencies and the high-density spiral pattern at higher and lower frequencies. This is typical of many of the Pareto-optimal trajectories found by the systems and methods described herein.

The value of genetic algorithms for waveform design is seen from the generated results. The Pareto-optimal trajectory indicated by the right-most arrow (c) of FIG. 13 has both less flow artifact and less off-resonance artifact than a uniform-density spiral corresponding to the star of FIG. 13.

Figure 15A:
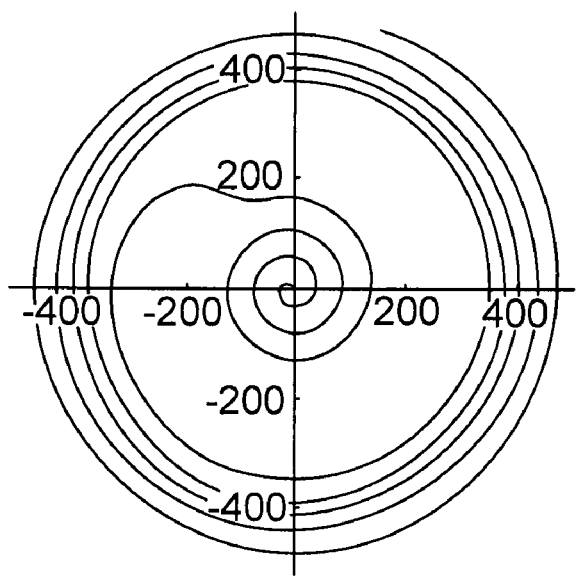
FIG. 15(a)–(c) depict various simulated off-resonance and flow images corresponding to data in FIG. 13.
Figure 15B:
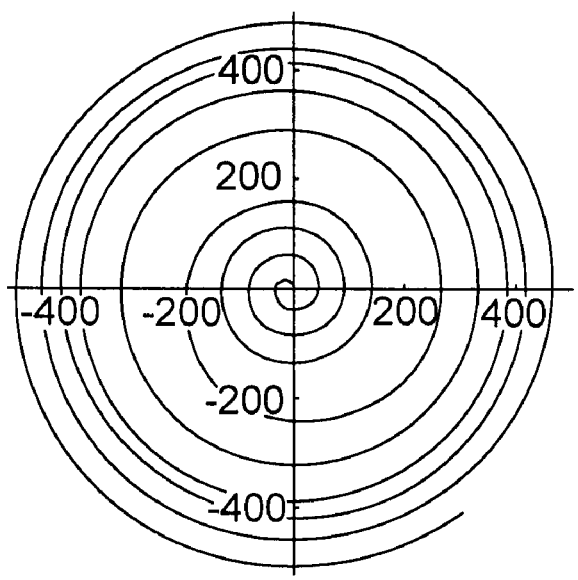
Figure 15C:
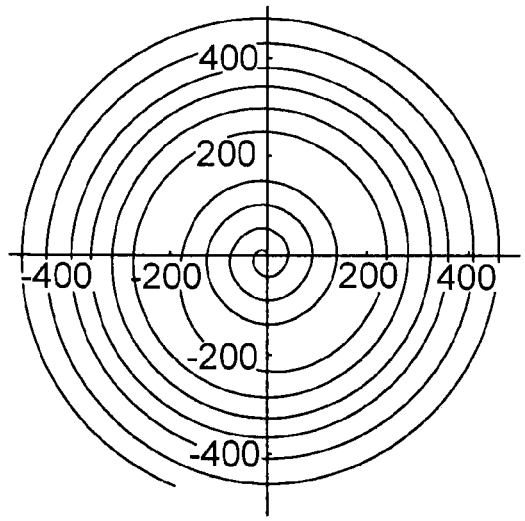

FIGS. 15(a)–(c) depicts, in the left column, a single-interleaf of each of the spiral trajectories indicated by the arrows (a)–(c) of FIG. 13; corresponding simulated off-resonance and flow images are shown in the middle and right columns, respectively. They are displayed here, from top to bottom, in order of decreasing flow-artifact and increasing off-resonance artifact. All Pareto-optimal trajectories designed according to this embodiment have six interleaves, and most display a low-density sampling pattern in the middle spatial-frequency range. Note the dramatic reduction in off-resonance blurring from (c) to (a)—which respectively correspond to the arrows (c) to (a) of FIG. 13—with little increase in flow artifact in the simulated images.

In FIG. 13, there is no sharp elbow region in the Pareto-optimal front; there is no clearly-defined point of diminishing returns. Therefore, one trajectory from approximately the middle of the Pareto-optimal region and the two extreme trajectories may be selected. Substantially all the Pareto-optimal trajectories found by the methods and systems described herein include six-interleaf variable-density spirals and most have a characteristic low-density region in the mid-range spatial frequency region. This region is clearly visible in the single interleaf shown in FIGS. 15(a)–(c). Noteworthy is the dramatic reduction in off-resonance blurring from (c) to (a) with little increase in flow artifact in the simulated images, as a result of the use of multiple interleaved spirals with low-density spiral regions in the mid-range frequency region. The methods and systems described herein facilitate the design of advantageous non-intuitive trajectories, which has not been considered with prior art techniques.

The resulting gradient waveforms developed as a result of employing genetic optimization may be readily implemented on modern MR scanners, because this optimization has been specifically designed with slew-rate and gradient-amplitude constraints enforced at all points in the trajectory. Those of ordinary skill in the art know, or can readily ascertain, that the NSGA-II may also be adapted to accommodate other constraints, such as gradient-induced peripheral-nerve stimulation limits, specific absorption rate (SAR) limits, and others.

While a six-interleaf uniform-density spiral is fairly close to Pareto-optimal, essentially all Pareto-optimal center-out trajectories designed by the k-space trajectory optimization of the systems and methods described herein include six-interleaf variable-density spirals. According to the embodiment wherein off-resonance blurring and flow artifacts are minimized, essentially all Pareto-optimal trajectories have six interleaves, and many have an unconventional, low-density spiral through the middle range of k-space frequencies. This is a result that is neither expected by nor predicted from previous k-space trajectory design methods.

The multi-objective optimization used in this embodiment has led to a class of optimal variable-density spiral trajectories that has not previously been proposed. This class of trajectories retains the desirable flow properties of spirals while alleviating some of the well-known off-resonance blurring. This could prove important in MR fluoroscopy applications where spirals may be useful, but where post-processing de-blurring algorithms often require a prohibitive amount of time.

Those of ordinary skill in the art know, or can readily ascertain, that although the embodiments described herein have been described mainly in relation to spiral trajectories, alternative embodiments exist that include employ trajectory types, e.g., rosettes, radials, etc. To accommodate various trajectory types other parameterizations may be used, such as high-bandwidth encoding, waveform interpolation, waveform decomposition, and others. Analogously, other potential optimization parameters may be used, for example, a non-central initial location (i.e., a trajectory that originates from a point in k-space other than the center); combinatorial options (such as whether to perform fat-suppression); contrast parameters; and timing parameters.

Figure 16:
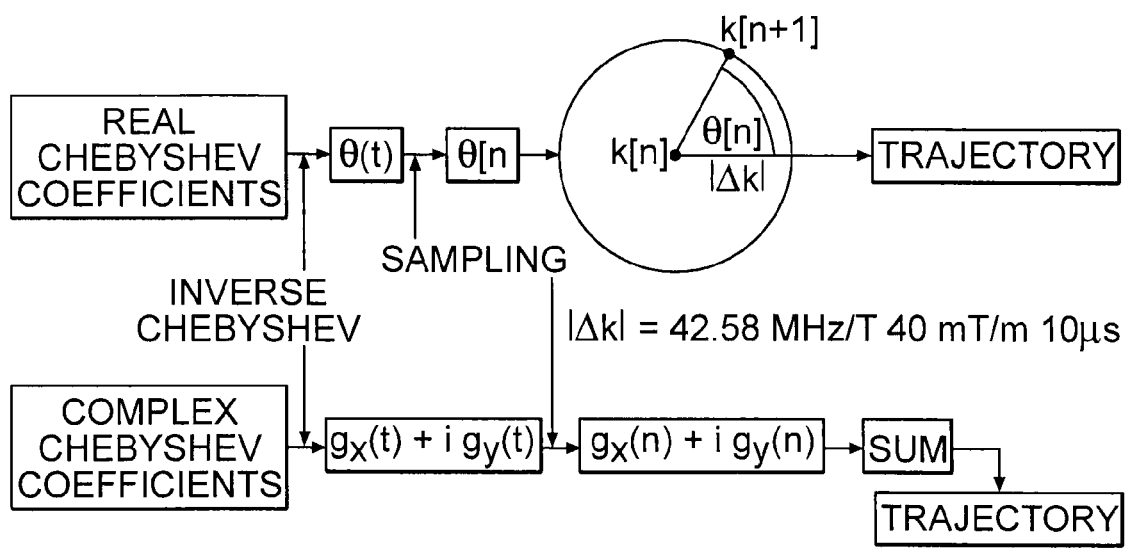
FIG. 16 depicts two alternative parameterizations of a spiral trajectory.

It may be shown that some Chebyshev polynomials are suitable for encoding spirals, radials, and Lissajous/Rosettes. FIG. 16 shows two ways by which a spiral may be parameterized by Chebyshev polynomials. As can be seen in the circle, the Chebyshev polynomials may be used to specify an angular displacement θ[n] from point k[n] on the spiral to point k[n+1], per increase in the radial distance |Δk|. Alternatively, Chebyshev polynomials may be used to represent points in k-space along a trajectory in Cartesian complex coordinates, as shown in FIG. 16.

The contents of all patent and non-patent references cited in the present disclosure are incorporated herein by reference and in entirety, including the Ph.D. dissertation titled "Optimal Design of MR Image Acquisition Techniques" by Brian M. Dale, Department of Biomedical Engineering, Case Western Reserve University, 8 Mar. 2004.

While the invention has been disclosed in connection with the embodiments shown and described herein, various modifications and improvements thereon will become readily apparent to those skilled in the art. For example, those of skill in the art know that the numbers in this embodiment (such as the trajectory representations, spiral density specification in terms of equal-width annular regions, the stepping increments, and the constraints on slew-rate and gradient amplitude) are illustrative only, and that modifications thereof do not depart from the scope of the invention.

Accordingly, the spirit and scope of the present invention is to be limited only by the following claims, which are to be interpreted as broadly as allowed under the law.

What is claimed is:

1. A magnetic resonance data acquisition method, comprising:
   designating a set of MRI data acquisition parameters, wherein at least one of said designated parameters is variable such that multiple solution values to the set of parameters are possible;
   designating at least two objective measures where each objective measure is representative of a quality of magnetic resonance data to be acquired, and wherein values of said objective measures are determined, at least in part, by one or more of said multiple solution values of said designated set of MRI data acquisition parameters;
   applying a multi-objective optimization algorithm to said designated set of MRI data acquisition parameters in order to cause said designated set of MRI data acquisition parameters to optimize to at least one single solution set of values for said set of parameters, from a plurality of possible solution set values, such that said single solution set of values is Pareto-optimal with respect to all said designated objective measures; and
   acquiring magnetic resonance data by configuring a magnetic resonance data acquisition apparatus to acquire the magnetic resonance data, based on, at least in part, said Pareto-optimal single solution set of values for said set of designated MRI data acquisition parameters.

2. The method of claim 1 wherein the MRI data acquisition parameters are selected from the group consisting of: pulse sequence design parameters; representation of a locus of a plurality of points to be sampled in k-space; a repetition time (TR); an echo time (TE); a number of interleaves, views or repetitions; a flip angle; a coil diameter; a fat suppression compensation; a flow compensation; a type of coil used; and a combination thereof.

3. The method of claim 2, wherein the locus of the plurality of points is selected from the group consisting of: a spiral trajectory, a radial trajectory, a rosette trajectory, a non-rectilinear trajectory, and a combination thereof.

4. The method of claim 3, wherein the spiral trajectory includes a substantially uniform-density spiral trajectory.

5. The method of claim 3, wherein the spiral trajectory includes a variable-density spiral (VDS) trajectory.

6. The method of claim 5, wherein the density of the variable-density spiral trajectory varies over a range comprising:
a first radial region;
a second radial region outside the first radial region and substantially concentric with the first radial region; and
a third radial region outside the second radial region and substantially concentric with each of the first and second radial regions.

7. The method of claim 6, wherein the density of the variable-density spiral in the second radial region is substantially lower than the density of the spiral in each of the first radial region and the third radial region.

8. The method of claim 3, wherein the spiral trajectory is represented by an integer parameter denoting the number of interleaves, and at least one real-number parameter denoting the radial density of the spiral as a function of the radial distance from the center of the spiral.

9. The method of claim 2, wherein a type of coil having said coil diameter is selected from the group consisting of:
a saddle coil, an opposed solenoid, and a combination thereof.

10. The method of claim 1, wherein at least one of the objective measures is selected from the group consisting of:
image acquisition time; image acquisition speed; aliasing energy; off-resonance blurring; flow-sensitivity; contrast-to-noise ratio (CNR); perceptual difference; point-spread function main-lobe width; engineering cost; quantitative imaging precision; an image quality measure; a data acquisition process quality measure; and a combination thereof.

11. The method of claim 1, further comprising designating at least one constraint to be imposed on the MRI data acquisition parameters.

12. The method of claim 11, wherein each of the at least one constraint is selected from the group consisting of:
a safety constraint, a hardware constraint, and a combination thereof.

13. The method of claim 12, wherein the safety constraint is selected from the group consisting of:
a gradient stimulation limit, a specific absorption rate (SAR) limit, and a combination thereof.

14. The method of claim 12, wherein the hardware constraint is selected from the group consisting of: a maximum slew rate, a gradient amplitude, and a combination thereof.

15. The method of claim 1, wherein the multi-objective optimization algorithm is an evolutionary algorithm.

16. The method of claim 15, wherein the evolutionary algorithm is a genetic algorithm.

17. The method of claim 16, wherein the genetic algorithm selects an initial population randomly.

18. The method of claim 16, wherein the genetic algorithm implements a reproduction operator according to one of a group consisting of:
a tournament selection, a proportionate selection, a ranking selection, and a combination thereof.

19. The method of claim 18, wherein the proportionate selection is performed according to one of another group consisting of:
a roulette wheel selection (RWS), a stochastic roulette-wheel selection (SRWS), and a combination thereof.

20. The method of claim 16, wherein the genetic algorithm implements a crossover operator.

21. The method of claim 20, wherein the crossover operator, includes a single-site crossover.

22. The method of claim 20, wherein the crossover operator includes a multiple-site crossover.

23. The method of claim 20, wherein the crossover operator is selected from the group consisting of:
a linear crossover; a bland crossover; a simulated binary crossover; a fuzzy recombination crossover; a uni-modal normally-distributed crossover; a simplex crossover; a fuzzy connectives-based crossover; an unfair average crossover; and a combination thereof.

24. The method of claim 16, wherein the genetic algorithm implements a mutation operator.

25. The method of claim 24, wherein the mutation operator is selected from the group consisting of:
a random mutation; a non-uniform mutation; a normally-distributed mutation; a polynomial mutation; and a combination thereof.

26. The method of claim 16, wherein the genetic algorithm implements elitism.

27. The method of claim 26, wherein the elitism includes local elitism.

28. The method of claim 26, wherein the elitism includes global elitism.

29. The method of claim 26 wherein, in at least one of the generations, the genetic algorithm preserves a predetermined percentage of the population as elites.

30. The method of claim 29, wherein the percentage is approximately 10%.

31. A method of designing a k-space trajectory for magnetic resonance data acquisition, comprising:
a. designating a set of k-space trajectory parameters, wherein said set of k-space trajectory parameters are to be manipulated in order to generate a plurality of solution set values of said set of k-space trajectory parameters starting from an initial solution set of values;
b. designating at least two objective measures that are representative of a quality of magnetic resonance data to be acquired, wherein values of said objective measures are determined, at least in part, by one or more of said plurality of solution set values of said designated set of k-space trajectory parameters;
c. defining at least one termination condition for each objective measure;
d. applying a genetic algorithm to the designated set of k-space trajectory parameters and to, only for a first iteration, said initial solution set of values, in order to produce at least one genetically modified solution set of values of said set of k-space trajectory parameters;
e. evaluating said objective measures, representative of a quality of magnetic resonance data to be acquired, based on, at least in part, said genetically modified solution set of values; and
f. determining when said evaluated objective measures associated with said genetically modified solution set of values meets at least one of said defined termination conditions of at least one of the objective measures; and
g. repeating steps d–f until said at least one of the termination conditions of at least one of the objective measures is met,
whereby the final result of step f, is a final set of genetically-modified parameter values of said set of k-space trajectory parameters and is Pareto-optimal with respect to all of said at least two objective measures which are representative of the quality of magnetic resonance data to be acquired.

32. The method of claim 31, wherein the k-space trajectory comprises a non-rectilinear trajectory.

33. The method of claim 31, wherein the k-space trajectory comprises a spiral trajectory.

34. The method of claim 33, wherein the k-space trajectory comprises a spiral trajectory with a substantially spiraling section and a substantially linear section.

35. The method of claim 33, wherein the spiral trajectory comprises interleaved spiral trajectories.

36. The method of claim 33, wherein the spiral trajectory comprises a variable-density spiral trajectory.

37. The method of claim 36, wherein the variable-density spiral trajectory has a lower density in at least one of a center section within k-space, an intermediate section within k-space, and an outer section within k-space.

38. The method of claim 37, wherein a density of the intermediate section within k-space is lower than a density of the center section within k-space and a density of the outer section within k-space.

39. The method of claim 36, wherein the center section within k-space, the intermediate section within k-space, and the outer section within k-space are arranged substantially concentrically around an origin of the k-space.

40. A method of designing a magnetic resonance pulse sequence, comprising:
   a. designating a set of magnetic resonance pulse sequence parameters, wherein said set of magnetic resonance pulse sequence parameters are to be manipulated in order to generate a plurality of solution set values of said set of magnetic resonance pulse sequence parameters starting from an initial solution set of values;
   b. designating at least two objective measures representative of a quality of magnetic resonance data to be acquired, wherein values of said objective measures are determined, at least in part, by one or more of said plurality of solution set values of said designated set of magnetic resonance pulse sequence parameters;
   c. defining at least one termination condition for each objective measure;
   d. applying a genetic algorithm to the designated set of magnetic resonance pulse sequence parameters and to, only for a first iteration, said initial solution set of values, in order to produce at least one genetically modified solution set of values of said set of magnetic resonance pulse sequence parameters;
   e. evaluating said objective measures representative of a quality of magnetic resonance data to be acquired based on, at least in part, said genetically modified solution set of values; and
   f. determining when said evaluated objective measures associated with said genetically modified solution set of values meets at least one of said defined termination conditions of at least one of the objective measures; and
   g. repeating steps d-f, until at least one of the termination conditions of at least one of the objective measures is met,
   whereby a final result of step f, is a final set of genetically-modified parameter values of said set of magnetic resonance pulse sequence parameters and is Pareto-optimal with respect to all of said at least two objective measures which are representative of the quality of magnetic resonance data to be acquired.

41. A system for generating a magnetic resonance pulse sequence, comprising:
   an apparatus configured for:
      designating a set of magnetic resonance pulse sequence parameters, wherein at least one of said designated parameters is variable such that multiple solution values to the set of parameters are possible,
      designating at least two objective measures where each objective measure is representative of a quality of magnetic resonance data to be acquired, and wherein values of said objective measures are determined, at least in part, by one or more of said multiple solution values of said designated set of magnetic resonance pulse sequence parameters, and
      applying a multi-objective optimization algorithm to said designated set of magnetic resonance pulse sequence parameters in order to cause said designated set of magnetic resonance pulse sequence parameters to optimize to at least one single solution set of values for said set of parameters, from a plurality of possible solution set values, such that said single solution set of values is Pareto-optimal with respect to all said designated objective measures; and
   a magnetic resonance pulse sequence generator receiving the Pareto-optimal single solution set of parameter values for said set of magnetic resonance pulse sequence parameters from said apparatus, and generating the pulse sequence specified by the single set of parameter values, in a magnetic resonance data acquisition.

* * * * *

UNITED STATES PATENT AND TRADEMARK OFFICE
CERTIFICATE OF CORRECTION

| | | |
|---|---|---|
| PATENT NO. | : 7,078,899 B2 | Page 1 of 1 |
| APPLICATION NO. | : 10/847224 | |
| DATED | : July 18, 2006 | |
| INVENTOR(S) | : Brian M. Dale et al. | |

It is certified that error appears in the above-identified patent and that said Letters Patent is hereby corrected as shown below:

In column 1, line 10:
Insert --Government Interest
The invention was made with government support under Grant Nos. CA88144 and CA81431 awarded by the National Institute of Health. The government has certain rights in the invention.--

Signed and Sealed this

Twelfth Day of December, 2006

JON W. DUDAS
*Director of the United States Patent and Trademark Office*